United States Patent [19]

Winnerl et al.

[11] Patent Number: 5,013,678
[45] Date of Patent: May 7, 1991

[54] METHOD OF MAKING AN INTEGRATED CIRCUIT COMPRISING LOAD RESISTORS ARRANGED ON THE FIELD OXIDE ZONES WHICH SEPARATE THE ACTIVE TRANSISTOR ZONES

[75] Inventors: Josef Winnerl, Landshut; Franz Neppl, Munich, both of Fed. Rep. of Germany

[73] Assignee: Siemens Aktiengesellschaft, Munich, Fed. Rep. of Germany

[21] Appl. No.: 305,193

[22] Filed: Mar. 16, 1989

Related U.S. Application Data

[62] Division of Ser. No. 113,480, Oct. 28, 1987, abandoned.

[30] Foreign Application Priority Data

Nov. 18, 1986 [DE] Fed. Rep. of Germany ....... 3639357

[51] Int. Cl.$^5$ .............................................. H01L 21/70
[52] U.S. Cl. .......................................... 437/52; 437/47; 437/51; 437/59; 437/60; 437/193; 437/200; 437/233; 437/235; 437/918; 357/51
[58] Field of Search ................. 357/51, 59 H; 437/47, 437/51, 52, 60, 918, 200, 59, 31, 193, 195, 233

[56] References Cited

U.S. PATENT DOCUMENTS

| 4,187,602 | 2/1980 | McElroy | 437/918 |
| 4,367,580 | 1/1983 | Guterman | 437/918 |
| 4,408,385 | 11/1983 | Mohan Rao et al. | 437/918 |
| 4,451,328 | 5/1984 | Dubois | 156/656 |
| 4,486,944 | 12/1984 | Hardee | 437/60 |
| 4,497,106 | 2/1985 | Momma et al. | 437/59 |
| 4,569,122 | 2/1986 | Chan | 29/577 |
| 4,619,038 | 10/1986 | Pintchovski | 437/200 |
| 4,717,686 | 1/1988 | Jacobs et al. | 437/56 |
| 4,737,472 | 4/1988 | Schaber et al. | 437/59 |
| 4,737,838 | 4/1988 | Watanabe | 357/51 |
| 4,902,640 | 2/1990 | Sachitano et al. | 437/31 |

FOREIGN PATENT DOCUMENTS 0204979 12/1986 European Pat. Off. .
0219641 4/1987 European Pat. Off. .
0025244 2/1984 Japan .

Primary Examiner—Brian E. Hearn
Assistant Examiner—Tom Thomas
Attorney, Agent, or Firm—Hill, Van Santen, Steadman & Simpson

[57] ABSTRACT

In an integrated circuit containing MOS transistors and/or bipolar transistors, the load resistors, which are arranged as thin-film elements on the field oxide zones which separate the active transistor zones, consist of polycrystalline silicon which is formed simultaneously with gate electrodes and/or the emitter and base terminal zones of the bipolar transistors on a substrate which contains the integrated circuit. The structuring of the load resistors is carried by way of an oxide mask which serves as an etch stop during the structuring of the gate electrode composed of a double layer of polysilicon and a silicide of a refractory metal. As only the polysilicon of the gate layer without overlying silicide is used for the load resistors, the sheet resistance of the load resistors can be set independently of that of the gates.

20 Claims, 1 Drawing Sheet

METHOD OF MAKING AN INTEGRATED CIRCUIT COMPRISING LOAD RESISTORS ARRANGED ON THE FIELD OXIDE ZONES WHICH SEPARATE THE ACTIVE TRANSISTOR ZONES

This is a division of application Ser. No. 113,480, filed Oct. 28, 1987, now abandoned.

BACKGROUND OF THE INVENTION

1. Field of the Invention

The present invention is in relation to an integrated circuit comprising metal-oxide-semiconductor (MOS) transistors and/or bipolar transistors and load resistors which are arranged as thin-film elements on the field oxide zones which separate active transistor zones, with gate electrodes and/or emitter or base terminals comprising a double layer of polycrystalline silicon and a silicide of a refractory metal, and further in relation to the process for the production thereof.

2. Description of the Prior Art

Modern processes for the production of bipolar transistors and MOS transistors having high switching speeds employ polycrystalline silicon layers as diffusion sources, terminal and gate materials. A further great advantage is the fact that resistors required in the circuits can be arranged as thin-film elements, in an extremely space-saving at low-capacitive design, on the field oxide zones which separate the active transistor zones of the circuit. A transistor circuit of this type is described, for example, by N. C. C. Lu et al and the publication IEEE Trans. El. Dev., ED-29, pages 682 to 690, April 1982.

In a mixed bipolar complementary-metal-oxide-semiconductor (CMOS) transistor circuit, the gate electrode, composed of polycrystalline silicon, can be used to form load resistors. Because of the higher work function of the gates, silicides of refractory metals or double layers of polycrystalline silicon and metal silicides are used as gate material. However, because the low sheet resistance (2-5 Ohm per square), these are not suitable to form load resistors with a sheet resistance in the kilo-ohm range and higher.

SUMMARY OF THE INVENTION

The object of the present invention is to provide an integrated semiconductor circuit of the type generally referred to above in which the gate layer of a CMOS or bipolar/CMOS circuit can be used for load resistors, but where the gate layer is of low resistance.

The above object is achieved, according to the present invention, in that the load resistors are ranged in the same layer as the gate electrodes and consist of doped, polycrystalline silicon layer structures and in that their terminals consist of a silicide of a refractory metal.

As only the polycrystalline silicon of the gate layer, without the overlying metal silicide, is used for the load resistors, while the gates comprise a double layer of polycrystalline silicon and metal silicide, so that a low sheet resistance of the gates and of the wiring in the gate plane (2-5 Ohm per square) is achieved, the sheet resistance of the load resistors can be set independently of that of the gates. This represents a fundamental feature of the invention.

The doping of the polycrystalline silicon layer must be adjusted sufficiently high to ensure that the work function of the gates is still adequate (sheet resistance less than 100 Ohms per square). However, it is also possible to achieve higher sheet resistances (exceeding 100 Ohms per square) by setting the work function of the gates by way of an additional ion implantation step independently of the doping of the load resistors. Load resistors of this type, composed of polycrystalline silicon, can easily be produced, for example, in bipolar CMOS technology with implanted emitters, such as is described, for example, in the European patent application 86106486.3, or with polysilicon emitters such as described, for example, in the European patent application 86111444.5, or in a pure CMOS technology (process ±or the production of complementary n-channel and p-channel-MOS-transistors).

BRIEF DESCRIPTION OF THE DRAWING

Other objects, features and advantages of the invention with respect to the structure and the particular processes for the production of polysilicon load resistors and integrated circuits containing MOS transistors, will be best understood from the following description, taken in conjunction with the accompanying drawing, on which.

In all of FIGS. 1-5, identical reference symbols apply to identical components.

DESCRIPTION OF THE PREFERRED EMBODIMENTS

Exemplary Embodiment 1

Figure 1:
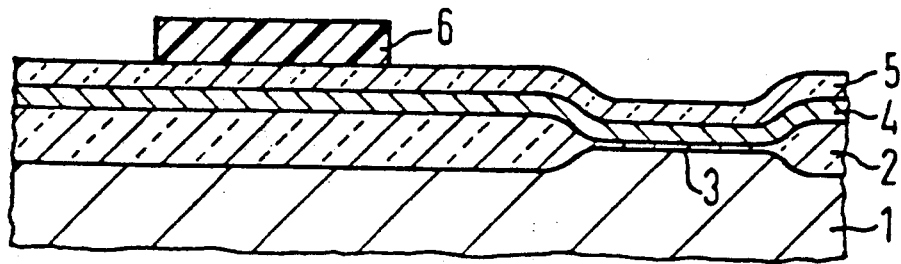
FIGS. 1-3 are cross-sectional views illustrating process steps in the method of the invention for constructing the apparatus of the invention in the production of a polysilicon load resistor alongside of a MOS transistor structure.

Referring to FIG. 1, the process steps, essential to the present invention, for the production of polysilicon load resistors in the gate layer of a bipolar/CMOS circuit will be described. Here, the process sequence for the formation of the structure illustrated in FIG. 1, with respect to the formation of the buried collector zone, the p- and n-well in the substrate, the field implantation, the formation of the field oxide, the base implantation, the formation of the gate oxide and the channel implantation, is carried out, for example, as in the process sequence described in the aforementioned European patent application 86106486.3, fully incorporated herein by this reference. For clarity, the buried collector zone, the implanted wells, the field implantation, the base implantation and the channel implantation have not been shown on the drawing. The silicon substrate or the trough zone (n- or p-well) has been designated with the reference character 1, the field oxide which separates the active transistor zone has the reference character 2, and the gate oxide has the reference character 3.

The first step which is essential to the invention comprises the deposition of a doped or undoped polycrystalline silicon layer 4. In the case of an undoped polycrystalline silicon layer 4, the doping is carried out following vapor deposition either by ion implantation or by diffusion. In either case, the sheet resistance of the polysilicon load resistor (14 in FIG. 3) is therefore set. Then a silicon oxide layer 5 is applied to the entire surface of the polycrystalline silicon layer 4. This silicon dioxide layer 5 is covered with a photoresist mask 6 defining the load resistance zone (14 in FIG. 3).

Figure 2:
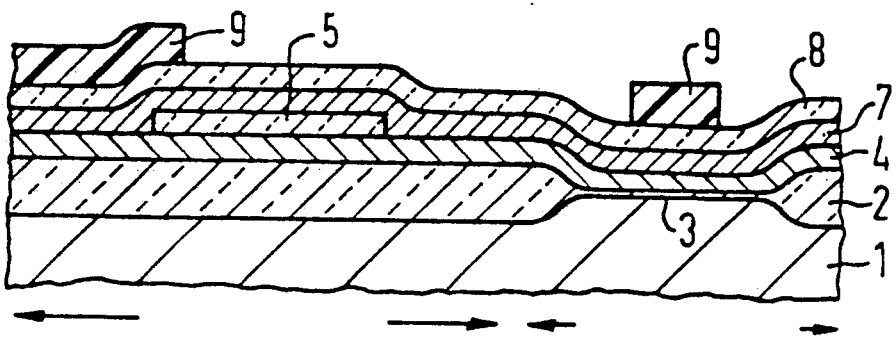

Referring to FIG. 2, the silicon dioxide layer 5 above the load resistor zone 14 is structured by way of the photoresist mask. Then a layer 7, composed, for example, of tantalum disilicide, is applied to the entire surface of this arrangement, onto which a further silicon dioxide layer 8 is applied which prevents undesired doping of the gates (24, 27 in FIG. 3) during the layer source/drain ion implantation of the MOS transistor. The arrangement is then provided with a photo-resist mask 9 in order to define the gates 24, 27 or terminals of a bipolar transistor, not shown, and the terminals 17 of the load resistors 14.

Figure 3:
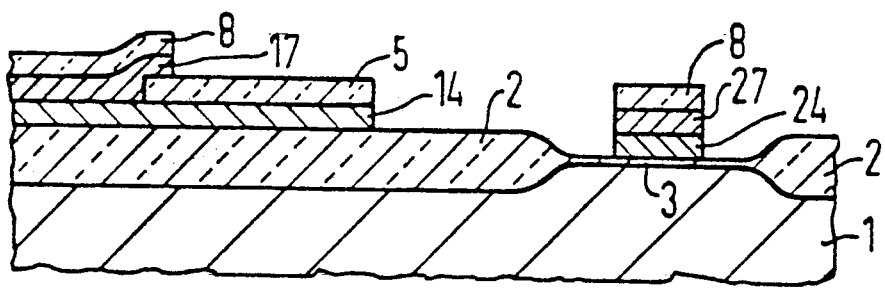

Referring to FIG. 3, a representation of the arrangement is illustrated which is obtained in the gate zone following the structuring of the oxide layer 8, the tantalum disilicide layer 7 and the polycrystalline silicon layer 4, where the first applied silicon dioxide layer 5, which forms a layer above the load resistor 14, serves as an etch stop during the polysilicon etching. The remainder of the process sequence (such as source/drain ion implantation steps, emitter implantation, intermediate insulation, formation of the base zones, contacting and passivation) is carried out in a manner known per se.

Exemplary Embodiment 2

In the first version of the invention according to FIGS. 1-3, the layer resistance of the polysilicon resistors 14 is limited by the fact that the doping of the polycrystalline silicon layer (4, 14, 24) must be sufficient to ensure the necessary work function of the gates. If, however, the work function of the gates 24, 27 is to be set independently of the sheet resistance of the resistors 14 (if, for example, highly ohmic resistors are required), an additional ion implantation of the tantalum silicide layer 7 is carried or the tantalum disilicide layer 7 is deposited for example with a n+doping. In order to set the gate work function, the dopant contained in the silicide is then diffused into the polycrystalline silicon layer 24, while the oxide mask 5 above the load resistor zone 14 serves as a diffusion barrier and thus prevents an increase in the doping in the region of the polysilicon load resistors 14. Further processing steps are carried out as described with reference to FIGS. 1-3.

Exemplary Embodiment 3

In contrast to the exemplary embodiments described in FIGS. 1-3, in the following process sequence selective silicizing of the source/drain zones of the MOS transistor will be described.

Figure 4:
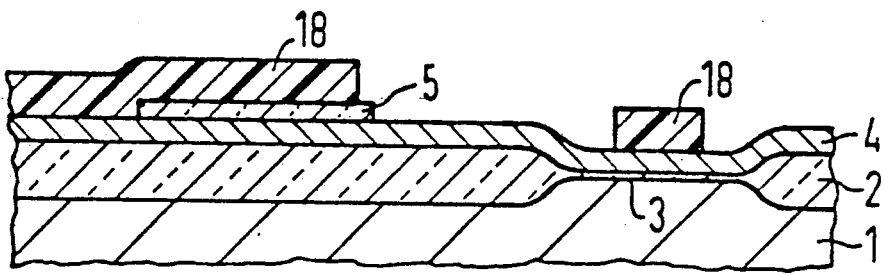
FIGS. 4 and 5 are cross-sectional illustrations showing the function of an arrangement using side-wall spacers in which the technique is employed in order to ensure the insulation of source-drain zones from the gate.

With reference to FIG. 4, on the basis of the process steps carried out in the exemplary embodiment 1 in accordance with FIG. 1, following the deposition of the polycrystalline silicon layer 4 and the oxide layer 5 on the silicon substrate 1 (or the n- or p-well zone), over the field oxide layer 2 and the gate oxide 3, and following the structuring of the oxide layer 5 in order to define the polysilicon load resistor zone 14, a photo-resist mask 18 is applied in order to define the gates 24, 27. The polycrystalline silicon layer 4 is structured using the photo-resist mask 18 as an etching mask.

Figure 5:
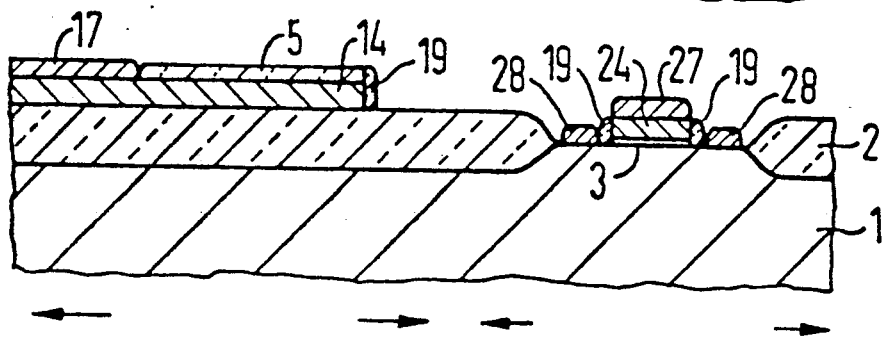

With reference to FIG. 5, by conformal deposition of silicon dioxide and anisotropic etching back of this layer, sidewall oxide spacers 19 are produced along the exposed side-walls of the polycrystalline silicon layer structures 14 and 24. The source/drain zones of the MOS transistor are exposed by the anisotropic etching.

In the subsequent tantalum disilicide deposition (27, 28), the side-wall spacers prevent silicide deposition along the side-walls of the resistors 14 and the gates 24 and therefore ensure that the source/drain zones (below the zones 28) are insulated from the gate electrode 24. The selective deposition of tantalum disilicide (17, 27, 28) is carried out on the polycrystalline silicon surfaces which are not covered by an oxide (5, 19, 2) to form the gates and the terminals. All the remaining process steps are carried out as described making reference to FIG. 3.

Although we have described our invention by reference to particular illustrating embodiments thereof, many changes or modifications of the invention may become apparent to those skilled in the art without departing from the spirit and scope of the invention. We therefore intend to include within the patent warranted hereon all such changes and modifications as may recently and properly be included in the scope of our contribution to the art.

We claim:

1. A method for production of a load resistor in an integrated circuit substrate containing a transistor having a terminal element and wherein the load resistor is arranged on a field oxide zone alongside an active transistor zone of the transistor on the substrate, comprising the steps of:

providing a polycrystalline silicon layer on the field oxide zone and at the transistor active zone;

applying a first oxide layer to a surface of the polycrystalline silicon layer;

covering the first oxide layer with a first photoresist mask shaped to define a zone for the load resistor;

structuring the first oxide layer with the first mask to create a structured oxide layer which defines the load resistance zone;

removing the first photoresist mask and applying a refractory metal silicide layer to a surface of the structured oxide layer and on the polycrystalline silicon layer at the transistor active zone;

applying a second oxide layer on the silicide layer at the load resistance zone and at the transistor active zone; and applying a second photoresist mask at the transistor active zone and at the load resistance zone and using said second photoresist mask to structure the polycrystalline silicon layer and silicide layer to form the terminal element at the transistor active zone and to structure the silicide layer and polycrystalline silicon layer at the load resistance zone to form the load resistor and a load resistance terminal therefor, said structured oxide serving as an etch stop mask when structuring the polycrystalline silicon layer to define the load resistor.

2. A method according to claim 1 wherein the transistor element comprises a terminal element of a bipolar transistor.

3. A method according to claim 1 wherein the transistor terminal element comprises a gate of an MOS transistor.

4. A method according to claim 1 wherein a sheet resistance of the load resistor is set by the polycrystalline silicon layer.

5. A method according to claim 4 wherein the polycrystalline silicon layer is initially undoped when applied and is then doped to set the sheet resistance of the load resistor.

6. A method according to claim 4 wherein the polycrystalline silicon layer is doped when initially applied to set the sheet resistance of the load resistor.

7. A method for production of a load resistor in an integrated circuit substrate containing a transistor having a terminal element and wherein the load resistor is arranged on a field oxide zone alongside an active transistor zone of the transistor on the substrate, comprising the steps of:

providing a polycrystalline silicon layer on the field oxide zone and a transistor active zone;

applying a first oxide layer to a surface of the polycrystalline silicon layer;

covering the first oxide layer with a first photoresist mask shaped to define a zone for the load resistor;

structuring the first oxide layer with the first mask to create a structured oxide layer which defines the load resistance zone;

removing the first photoresist mask and applying a second photoresist mask on the polycrystalline silicon layer above the field oxide zone, on at least a portion of the structured oxide zone, and on the polycrystalline silicon layer at the active transistor zone, and using the second photoresist mask to structure the polycrystalline silicon layer in conjunction with the structured first oxide layer to define the load resistor and to define the terminal element at the active transistor zone;

by oxide deposition, creating a sidewall oxide spacer along an exposed side-wall of the polycrystalline silicon layer forming the load resistor and creating a sidewall oxide spacer at sidewalls of the transistor terminal element; and depositing a refractory metal silicide layer at a surface of the load resistor which is not covered by the structured first oxide layer and at a surface of the polycrystalline silicon layer defining the terminal element at the active transistor zone.

8. A method according to claim 7 wherein the transistor terminal element comprises a gate of an MOS transistor.

9. A method according to claim 7 wherein the transistor element comprises a terminal element of a bipolar transistor.

10. A method according to claim 7, wherein the sheet resistance of the load resistor is set by the polycrystalline silicon layer.

11. A method according to claim 10, wherein the polycrystalline silicon layer is initially undoped when applied and is then doped to set the sheet resistance of the load resistor.

12. A method according to claim 10, wherein the polycrystalline silicon layer is doped when initially applied and sets the sheet resistance of the load resistor.

13. A method for production of a load resistor in an integrated circuit substrate containing an MOS transistor having a gate electrode and wherein the load resistor is arranged on a field oxide zone alongside an active transistor zone of the MOS transistor on the substrate, comprising the steps of:

providing a polycrystalline silicon layer on the field oxide zone and at the MOS transistor active zone;

applying a first oxide layer to a surface of the polycrystalline silicon layer;

covering the first oxide layer with a first photoresist mask shaped to define a zone for the load resistor;

structuring the first oxide layer with the first mask to create a structured oxide layer which defines the load resistance zone;

removing the first photoresist mask and applying a refractory metal silicide layer to the surface of the structured oxide layer and on the polycrystalline silicon layer at the transistor active zone;

applying a second oxide layer on the silicide layer at the load resistance zone and at the transistor active zone; and applying a second photoresist mask at the transistor active zone and at the load resistance zone and using said second photoresist mask to structure the polycrystalline silicon layer and silicide layer to form the gate electrode at the transistor active zone and to structure the silicide layer and polycrystalline silicon layer at the load resistance zone to form the load resistor and a load resistance terminal therefor, said structured oxide serving as an etch stop mask when structuring the polycrystalline silicon layer to define the load resistor.

14. A method according to claim 13, wherein a sheet resistance of the load resistor is set by the polycrystalline silicon layer.

15. A method according to claim 14, wherein the polycrystalline silicon layer is initially undoped when applied and is then doped to set the sheet resistance of the load resistor.

16. A method according to claim 14, wherein the polycrystalline silicon layer is doped when initially applied and sets the sheet resistance of the load resistor.

17. A method for production of a load resistor in an integrated circuit substrate containing an MOS transistor having a gate electrode and wherein the load resistor is arranged on a field oxide zone alongside an active transistor zone of the MOS transistor on the substrate, comprising the steps of:

providing a polycrystalline silicon layer on the field oxide zone and at the MOS transistor active zone;

applying a first oxide layer to a surface of the polycrystalline silicon layer;

covering the first oxide layer with a first photoresist mask shaped to define a zone for the load resistor;

structuring the first oxide layer with the first mask to create a structured oxide layer which defines the load resistance zone;

removing the first photoresist mask and applying a second photoresist mask on the polycrystalline silicon layer above the firle oxide zone, on at least a portion of the structured oxide zone, and on the polycrystalline silicon layer at the active transistor zone, and using the second photoresist mask to structure the polycrystalline silicon layer in conjunction with the structured first oxide layer to define the load resistor and to define the gate electrode at the active transistor zone;

by oxide deposition creating a sidewall oxide spacer along an exposed side-wall and creating a sidewall oxide of the polycrystalline silicon layer forming the load resistor and creating a sidewall oxide spacer at sidewalls of the transistor gate electrode; and depositing a refractory metal silicide layer at a surface of the load resistor which is not covered by the structured first oxide layer and at a surface of the polycrystalline silicon layer defining the gate electrode at the active transistor zone.

18. A method according to claim 17, wherein a sheet resistance of the load resistor is set by the polycrystalline silicon layer.

19. A method according to claim 18, wherein the polycrystalline silicon layer is initially undoped when applied and is then doped to set the sheet resistance of the load resistor.

20. A method according to claim 18, wherein the polycrystalline silicon layer is doped when initially applied and sets the sheet resistance of the load resistor.

* * * * *